(12) United States Patent
Rocher

(10) Patent No.: US 9,835,667 B2
(45) Date of Patent: Dec. 5, 2017

(54) METHOD FOR DETECTING A WIRING FAULT IN A CAPACITIVE SENSOR

(71) Applicants: CONTINENTAL AUTOMOTIVE FRANCE, Toulouse (FR); CONTINENTAL AUTOMOTIVE GmbH, Hannover (DE)

(72) Inventor: Jacques Rocher, Saint Orens de Gameville (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 110 days.

(21) Appl. No.: 14/872,720

(22) Filed: Oct. 1, 2015

(65) Prior Publication Data

US 2016/0097799 A1   Apr. 7, 2016

(30) Foreign Application Priority Data

Oct. 1, 2014 (FR) .................................... 14 59372

(51) Int. Cl.
   *G01R 31/02*       (2006.01)
   *G01L 27/00*       (2006.01)

(52) U.S. Cl.
   CPC .......... *G01R 31/024* (2013.01); *G01L 27/002* (2013.01); *G01L 27/007* (2013.01)

(58) Field of Classification Search
   CPC   G01R 31/08; G01R 31/2882; G01R 31/3183; G01R 31/31917; G01R 31/024;

(Continued)

(56) References Cited

U.S. PATENT DOCUMENTS

| 4,742,515 A | 5/1988 | Dabholkar et al. |
| 7,562,558 B2 * | 7/2009 | Horner ................. F02D 35/027 73/35.09 |

(Continued)

FOREIGN PATENT DOCUMENTS

| DE | 10 150 377 A1 | 4/2003 |
| FR | 2 902 519 A1 | 12/2007 |

(Continued)

OTHER PUBLICATIONS

FR Search Report, dated May 21, 2015, from corresponding FR application.

*Primary Examiner* — Vinh Nguyen
(74) *Attorney, Agent, or Firm* — Young & Thompson

(57) ABSTRACT

A method for detecting a wiring fault in a capacitive sensor (1), such as a knock sensor, connected, via a passive acquisition interface (5), to a communication port (P1), that can be configured in either input mode or output mode, of a computer (2), wherein the communication port (P1) is configured in output mode, and a square wave voltage Vn capable of at least partially charging the capacitors (C6, C7, C8a, C8b, C10) of the acquisition interface (5) and the capacitive sensor (1) is generated during a time interval Tc, after which the communication port is switched to its input mode, so that at least one data element representative of the voltage of the capacitors and of the capacitive sensor is acquired, and finally these data are compared with previously stored reference data so that a wiring fault can be deduced if there is no matching between the data.

14 Claims, 2 Drawing Sheets

(58) Field of Classification Search
CPC  G01R 27/26; G01R 31/02; G01R 31/318342; G01R 27/18; G01R 29/0273; G01R 31/1272; G01R 31/346; G06F 11/263; G01L 27/002; G01N 21/88; G01N 21/89; G05B 19/048; H04L 1/00; H04L 1/20; H04L 25/03019; H04L 25/242
See application file for complete search history.

(56) References Cited

U.S. PATENT DOCUMENTS

| | | | |
|---|---|---|---|
| 7,769,536 B2* | 8/2010 | Hamama | F02D 35/027 123/406.38 |
| 7,880,476 B1* | 2/2011 | McKenzie | G01R 31/021 324/519 |
| 2002/0097056 A1* | 7/2002 | Blades | G01R 1/06788 324/536 |
| 2009/0064762 A1 | 3/2009 | Horner et al. | |
| 2009/0278547 A1* | 11/2009 | Acena | G01R 31/025 324/509 |
| 2012/0262183 A1* | 10/2012 | Kawamura | G01R 31/025 324/509 |
| 2015/0161829 A1* | 6/2015 | Julson | G01R 31/02 701/32.8 |

FOREIGN PATENT DOCUMENTS

| | | |
|---|---|---|
| FR | 2 912 814 A1 | 8/2008 |
| FR | 2 912 815 A1 | 8/2008 |
| FR | 2 991 451 A1 | 12/2013 |
| JP | S 5811824 A1 | 1/1983 |

* cited by examiner

METHOD FOR DETECTING A WIRING FAULT IN A CAPACITIVE SENSOR

FIELD OF THE INVENTION

The invention relates to a method for detecting a wiring fault in a capacitive sensor, such as a knock sensor, connected, via a passive acquisition interface comprising capacitors, to a computer communication port that can be configured in either input mode or output mode.

BACKGROUND OF THE INVENTION

For the purpose of defecting wiring faults in capacitive sensors such as knock sensors, an existing solution, described, notably, in patent FR 2 912 814, takes the form of a method by which:
- a periodic reference signal is applied to the terminals of the capacitive sensor by means of a periodic square signal generator permanently connected to said capacitive sensor,
- the capacitance at the terminals of the capacitive sensor is measured,
- and the measured capacitance is compared with a nominal capacitance.

In practice, this technique has been shown to provide reliable detection of wiring faults of the short-circuit and open-circuit types.

However, with this technique each capacitive sensor and its acquisition interface are subject to constraints relating to the generation and routing of a periodic signal.

SUMMARY OF IN THE INVENTION

The present invention is intended to overcome this drawback, and its primary object is to provide a method for detecting wiring faults in a capacitive sensor, connected by a passive acquisition interface to a computer, the use of this method not being subject to any constraints in terms of hardware (that is to say, no added components or wiring are required).

Another object of the invention is to provide a method for detecting wiring faults which can be applied without any modification of the hardware of existing computers.

For this purpose, the invention proposes a method for detecting a wiring fault in a capacitive sensor such as a knock sensor, connected, via a passive acquisition interface comprising capacitors, to a computer communication port that can be configured in either input mode or output mode; according to the invention, this method is characterized in that:
- in a preliminary calibration step, a square wave voltage Vn capable of at least partially charging the capacitors of said acquisition interface and the capacitive sensor is delivered to the acquisition interface during a charging time Tc, after which at least one data element, called the reference data element, is acquired and stored, this data element being representative, after at least one time interval $tm \geq 0$ following the interruption of the square wave voltage, of the voltage of said capacitors and capacitive sensor in the absence of a wiring fault,
- and procedures for detecting wiring faults are followed, these procedures consisting of:
  - configuring the communication port in output mode and generating a square wave voltage Vn during a charging time Tc,
  - switching the communication port to its input mode at the end of the charging time Tc, and acquiring at least one data element, called the measured data element, which is representative, after each time interval $tm \geq 0$ following the interruption of the square wave voltage, of the voltage of the capacitors and of the capacitive sensor,
  - and comparing each measured data element with the corresponding reference data element, so that a wiring fault in the capacitive sensor can be deduced if said data elements do not coincide.

Thus, according to the invention, the square wave voltage is generated by the computer on a communication port configured in output mode, which is then switched to input mode for the acquisition of the data representative of the charge of the capacitors of the acquisition interface and of the capacitive sensor.

The method according to the invention can therefore be used to provide a diagnosis of the capacitive sensors by a simple software adaptation of existing computers, without requiring the addition of electronic components or the provision of additional wire links.

According to a first advantageous embodiment of the invention, the reference and measurement data are acquired at the time of the interruption of the square wave voltage, for the purpose of comparing the reference and measurement data representative of the charging voltage of the capacitors and of the capacitive sensor after the generation of said square wave voltage.

According to a second advantageous embodiment of the invention, the reference and measurement data are acquired after a time interval $tm > 0$ following the interruption of the square wave voltage, for the purpose of comparing the reference and measurement data representative of the discharge voltage of the capacitors and of the capacitive sensor.

According to this second embodiment, additionally, a data element representative of the time constant of the voltage during the discharge of the capacitors and of the capacitive sensor is advantageously acquired according to the invention.

Furthermore, the method according to the invention is mainly applicable to capacitive sensors wired in common mode, and can be used to detect wiring faults in the wire link connecting the capacitive sensor to the communication port.

This method is also applicable to capacitive sensors wired in differential mode by means of an acquisition interface having two branches, each connecting one terminal of said capacitive sensor to a communication port that can be configured in either input mode or output mode.

For this application, additionally, a number of strategies may be used.

Advantageously, according to the invention, a first strategy may thus be to divide each detection procedure into two successive steps, namely a first step in which a square wave voltage Vn is generated on one of the communication ports, while the other communication port is grounded, and a second step in which the functions of the two communication ports are reversed.

Advantageously, according to the invention, a second strategy may be to generate, either simultaneously or with a time lag, a square wave voltage Vn during the charging times Tc1 and Tc2 respectively, on each of the two communication ports, and to acquire, for each of said communication ports, the data representative of the voltage of the capacitors and of the capacitive sensor, respectively, at the ends of the charging times Tc1 and Tc2.

According to this principle, additionally, the information obtained from the processing of the data acquired from each of the communication ports may be processed separately or may be correlated.

Furthermore, during the preliminary calibration step, and advantageously according to the invention, reference data representative of the voltage of the capacitors and of the capacitive sensor are also acquired and stored for different types of wiring faults, so that said wiring faults can be distinguished.

BRIEF DESCRIPTION OF THE DRAWINGS

Other characteristic objects and advantages of the invention will be apparent from the following detailed description, referring to the attached drawings, which represent an advantageous embodiment by way of non-limiting example. In these drawings:

FIG. 2b shows a voltage curve of the capacitors and of the capacitive sensor, plotted in the absence of a wiring fault, during the generation of the square wave voltage Vn shown in FIG. 2a, and FIG. 2c shows a voltage curve of the capacitors and of the capacitive sensor, plotted in the presence of a wiring fault, during the generation of the square wave voltage Vn shown in FIG. 2a.

DETAILED DESCRIPTION OF THE INVENTION

Figure 1:
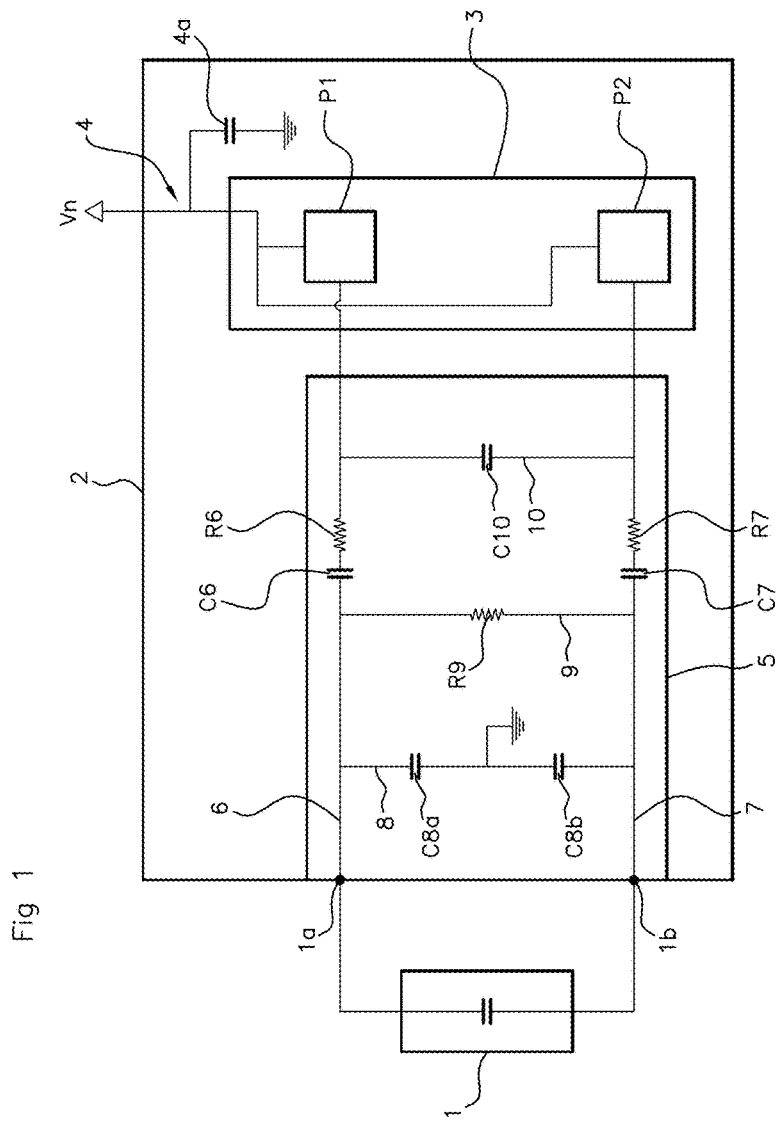
FIG. 1 is a schematic representation of a device for the application of the method according to the invention, comprising a capacitive sensor and means for acquiring and processing the signals delivered by this capacitive sensor.

The device shown schematically in FIG. 1 takes the form of a device for acquiring and processing the measurement signals delivered by a capacitive sensor 1, of the knock sensor type, wired in differential mode.

This acquisition and processing device takes the form of a computer 2 comprising, in the first place, a microcontroller 3 connected to a voltage source Vn by a power supply circuit 4 having a power supply buffer capacitor 4a.

This microcontroller 3 is provided, in a conventional manner, with a plurality of communication ports, including two communication ports P1, P2, shown in FIG. 1, for connection to the capacitive sensor 1.

The computer 1 also comprises a passive interface 5 for the acquisition of the signals delivered by the capacitive sensor 1. This acquisition interface 5 has two main branches 6, 7, each connecting one of the terminals 1a, 1b of the capacitive sensor 1 to one of the communication ports P1, P2, each of these main branches including a capacitor C6 or C7 respectively, and a resistor R6 or R7 respectively, connected in series.

The acquisition interface 5 also has three secondary branches 8, 9, 10, each extending between the two main branches 6, 7, and consisting of:
a first secondary branch 8 (the branch farthest from the microcontroller 3), in which two capacitors C8a, C8b are connected in series on either side of a grounded central connection,
a second, middle secondary branch 9 including a resistor R9, connecting the two main branches 6, 7 at two points of the latter located between the first branch 8 and the capacitors C6, C7,
and a third secondary branch 10 (the branch nearest the microcontroller 3) including a capacitor C10, connecting the two main branches 6, 7 at two points of the latter separated from the middle secondary branch 9 by the capacitor C6 and the resistor R6, and by the capacitor C7 and the resistor R7, respectively.

Additionally, each communication port P1, P2 of the microcontroller 3 is a digital communication port that can be configured in either input mode for signal acquisition, or output mode, at level 1 (with a potential equal to Vn) or at level 0 (with the communication port grounded).

The object of the method according to the invention is to detect wiring faults in the capacitive sensor 1, and for this purpose, according to a first embodiment, this detection method consists in dividing each detection procedure into two similar successive steps, namely:
a first step in which a square wave voltage Vn is generated for a time Tc on one of the communication ports P1, while the other communication port P2 is grounded and is configured for this purpose in level 0 output mode,
and a second step in which the functions of the two communication ports P1, P2 are reversed.

Figure 2A:
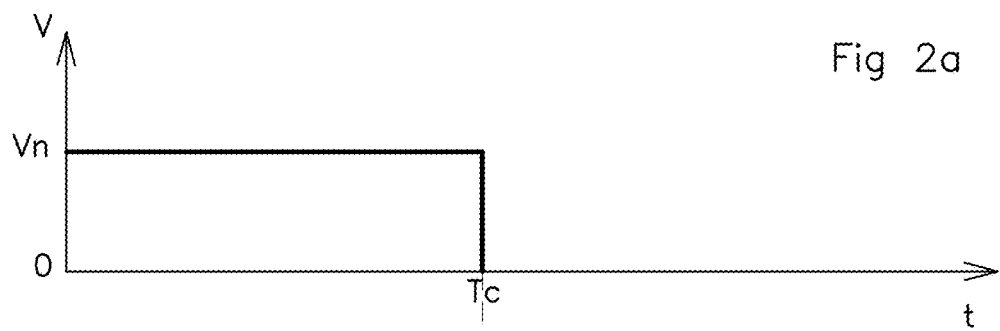
FIG. 2a shows a square wave voltage Vn such as that generated on a communication port by the method according to the invention.
Figure 2B:
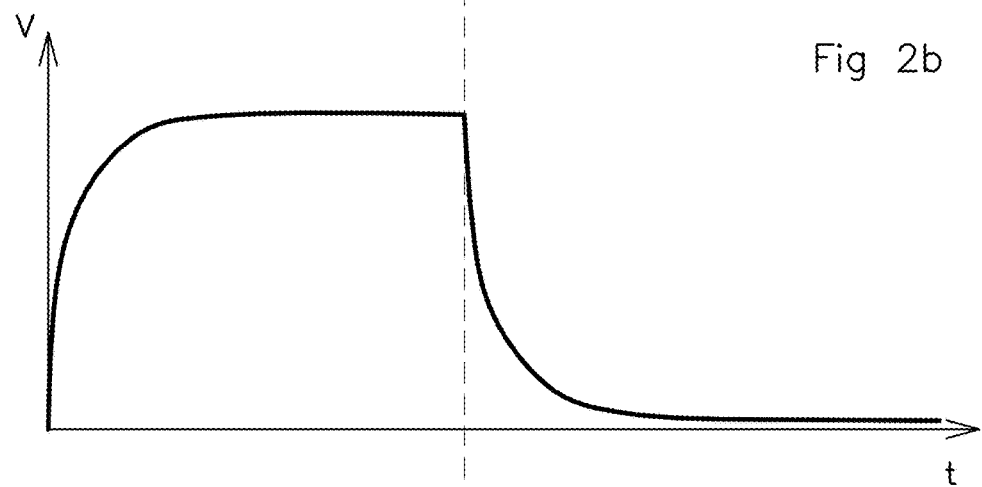

According to this principle, the calibration step consists in the preliminary generation of a square wave voltage Vn shown in FIG. 2a, during a time interval Tc, in one of the main branches 6 or 7 of the acquisition interface 5 "guaranteed" to be free of wiring faults, the square wave voltage being adapted as shown in FIG. 2b to provide at least partial charging of the capacitors C6, C7, C8a, C8b, C10 and of the capacitive sensor 1, followed by the discharge of said capacitors and capacitive sensor after the interruption of said square wave voltage.

This preliminary step then consists in acquiring and storing one or more reference data elements representative of:
the charging voltage of the capacitors of the acquisition interface 5 and of the capacitive sensor 1 at the time of the interruption of the square wave voltage Vn,
and/or a discharge voltage or voltages of the capacitors of the acquisition interface 5 and of the capacitive sensor 1 after one or more time intervals tm>0 following the interruption of the square wave voltage Vn, one of said data elements being, for example, a data element representative of the time constant.

According to the principle described above, this preliminary calibration step may also include the acquisition and storage of data representative of the voltage of the capacitors C6, C7, C8a, C8b, C10 and of the capacitive sensor 1 for different types of wiring faults, so that said wiring faults can be distinguished.

When this calibration step has been completed, the first step of each detection procedure consists, as stated above, in configuring one of the communication ports, for example P2, in level 0 output mode (with this communication port P2 grounded), and executing a procedure of:
configuring the other communication port P1 in level 1 output mode (with the potential of the communication port P1 equal to Vn), so as to generate a square wave voltage with a value of Vn during a time interval Tc identical to the square wave voltage time Tc during the preliminary calibration step,
then switching the communication port P1 to its input mode, and acquiring measured data corresponding to the stored reference data,
and finally comparing the measured data and the stored data, so that it is possible to deduce an absence of a wiring fault in the capacitive sensor 1, or a wiring fault of the short-circuit type, or a wiring fault of the open-circuit type.

Figure 2C:
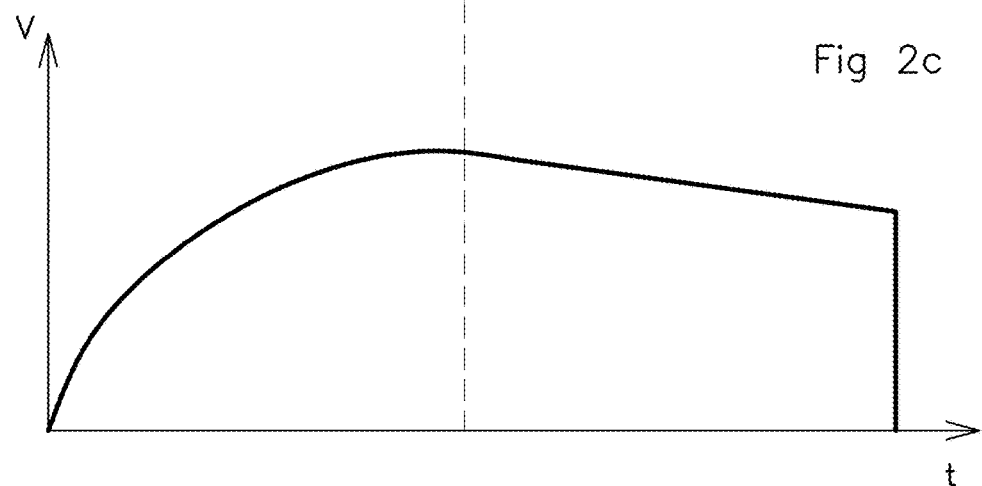

By way of example, FIG. 2c shows the voltage curve of the capacitors of the acquisition interface 5 and of the capacitive sensor 1, plotted, in the presence of a wiring fault, during the generation of the square wave voltage Vn.

Comparison of this curve with the curve of FIG. 2b representing the voltage curve in the absence of wiring faults reveals very significant differences, notably in respect of the time constants of these voltages, which enable a wiring fault to be unequivocally diagnosed.

The detection procedure subsequently comprises a second step in which, as stated above, the functions of the communication ports P1, P2 are reversed, so that this step consists in configuring the communication port P1 in level 0 output mode, and applying a procedure identical to that described above to the other communication port P2.

It should also be noted that each of the steps described above can be used, when applied to a capacitive sensor wired in common mode, to detect wiring faults in the wire link connecting this capacitive sensor to the communication port.

Additionally, according to the invention, a second strategy for detecting wiring faults in a capacitive sensor 1 wired in differential mode is that of dispensing with the execution of the aforesaid two successive steps, and instead generating, either simultaneously or with a time lag, a square wave voltage Vn during charging times Tc1 and Tc2 respectively, on each of the two communication ports P1 and P2, and then acquiring, for each of said communication ports, the data representative of the voltage of the capacitors of the acquisition interface 5 and of the capacitive sensor respectively, at the ends of the charging times Tc1 and Tc2.

According to this principle, advantageously, the information obtained from the processing of the data acquired from each of the communication ports P1 and P2 may be processed independently or may be correlated, so that many possibilities are provided for the selection of significant reference data for the purpose of diagnosing wiring faults and distinguishing the different types of wiring fault.

By executing either two successive detection steps or a single step, the method according to the invention therefore makes it possible, without requiring the addition of electronic components or the provision of additional wire links, to detect any wiring faults capable of affecting the operation of a capacitive sensor 1 wired in differential mode, and to distinguish the different types of wiring fault.

The invention claimed is:

1. A method for detecting a wiring fault in a capacitive sensor connected to at least one communication port of a computer including a passive acquisition interface comprising capacitors, the capacitive sensor being connected to the communication port via the passive acquisition interface, the communication port being configured in either an input mode or an output mode the method comprising:

in a preliminary calibration step, delivering a square wave voltage capable of at least partially charging the capacitors of said acquisition interface and the capacitive sensor to the acquisition interface during a charging time by the computer, then acquiring and storing at least one reference data element after delivering the square wave voltage, the reference data element being representative, after at least one time interval $tm \geq 0$ following an interruption of the square wave voltage, of the voltage of said capacitors and the capacitive sensor in the absence of a wiring fault; and detecting wiring faults by configuring, by a microcontroller, the communication port in the output mode and generating a square wave voltage during at least one charging time Tc, switching, by the microcontroller, the communication port to the input mode at the end of the charging time, and acquiring at least one measured data element, which is representative, after each time interval $tm \geq 0$ following the interruption of the square wave voltage by the microcontroller, of the voltage of the capacitors and of the capacitive sensor, and comparing, by the microcontroller, each measured data element with the corresponding reference data element, so that a wiring fault in the capacitive sensor is deduced when said data elements do not coincide.

2. The detection method as claimed in claim 1, wherein the at least one reference data element and the at least one measurement data element are acquired at the time of the interruption of the square wave voltage, for the purpose of comparing the at least one reference data element and the at least one measurement data element representative of the charging voltage of the capacitors and of the capacitive sensor after the generation of said square wave voltage.

3. The method as claimed in claim 2, wherein the method detects wiring faults in the capacitive sensor that is wired in differential mode by the acquisition interface having two branches, each branch connecting one terminal of said capacitive sensor to a communication port of the at least one communication port, wherein each detection procedure is divided into two successive steps, including a first step in which the square wave voltage is generated on one of the at least one communication port, while another one of the at least one communication port is grounded, and a second step in which the functions of the two communication ports are reversed.

4. The detection method as claimed in claim 1, wherein the at least one reference data element and the at least one measurement data element are acquired after a time interval $tm > 0$ following the interruption of the square wave voltage, for the purpose of comparing the at least one reference data element and the at least one measurement data element representative of a discharge voltage of the capacitors and of the capacitive sensor.

5. The detection method as claimed in claim 4, wherein a data element representative of the voltage time constant is acquired by the computer during the discharging of the capacitors and of the capacitive sensor.

6. The detection method as claimed in claim 5, wherein in the preliminary step, reference data representative of the voltage of the capacitors and of the capacitive sensor are also acquired and stored for different types of wiring faults, so that said wiring faults are able to be distinguished.

7. The method as claimed in claim 5, wherein the method detects wiring faults in the capacitive sensor that is wired in a differential mode by the acquisition interface having two branches, each branch connecting one terminal of said capacitive sensor to a communication port of the at least one communication port, wherein each detection procedure is divided into two successive steps, including a first step in which the square wave voltage is generated on one of the at least one communication port, while another one of the at least one communication port is grounded, and a second step in which the functions of the two communication ports are reversed.

8. The detection method as claimed in claim 4, wherein in the preliminary step, reference data representative of the voltage of the capacitors and of the capacitive sensor are also acquired and stored for different types of wiring faults, so that said wiring faults are able to be distinguished.

9. The method as claimed in claim 4, wherein the method detects wiring faults in the capacitive sensor that is wired in a differential mode by the acquisition interface having two branches, each branch connecting one terminal of said capacitive sensor to a communication port of the at least one communication port, wherein each detection procedure is divided into two successive steps, including a first step in which the square wave voltage is generated on one of the at least one communication port, while another one of the at least one communication port is grounded, and a second step in which the functions of the two communication ports are reversed.

10. The detection method as claimed in claim 1, wherein in the preliminary step, reference data representative of the voltage of the capacitors and of the capacitive sensor are also acquired and stored for different types of wiring faults, so that said wiring faults are able to be distinguished.

11. The method as claimed in claim 10, wherein the method detects wiring faults in the capacitive sensor that is wired in a differential mode by the acquisition interface having two branches, each branch connecting one terminal of said capacitive sensor to a communication port of the at least one communication port, wherein each detection procedure is divided into two successive steps, including a first step in which the square wave voltage is generated on one of the at least one communication port, while another one of the at least one communication port is grounded, and a second step in which the functions of the two communication ports are reversed.

12. The method as claimed in claim 1, wherein the method detects wiring faults in the capacitive sensor that is wired a in differential mode by the acquisition interface having two branches, each branch connecting one terminal of said capacitive sensor to a communication port of the at least one communication port, wherein each detection procedure is divided into two successive steps, including a first step in which the square wave voltage is generated on one of the at least one communication port, while another one of the at least one communication port is grounded, and a second step in which the functions of the two communication ports are reversed.

13. The method as claimed in claim 1, wherein the method detects wiring faults in capacitive sensor wired in a differential mode by the acquisition interface having two branches, each branch connecting one terminal of said capacitive sensor to a communication port of the at least one communication port, wherein the square wave voltage Vn is generated, either simultaneously or with a time lag, during charging times Tc1 and Tc2 respectively of the at least one charging time, on each of the two communication ports, and the data representative of the voltage of the capacitors and of the capacitive sensor respectively are acquired, for each of said communication ports, at the ends of the charging times Tc1 and Tc2, respectively.

14. The detection method as claimed in claim 2, wherein in the preliminary step, reference data representative of the voltage of the capacitors and of the capacitive sensor are also acquired and stored for different types of wiring faults, so that said wiring faults are able to be distinguished.

\* \* \* \* \*